United States Patent
Choi et al.

(10) Patent No.: US 12,325,916 B2
(45) Date of Patent: Jun. 10, 2025

(54) FILM FORMING APPARATUS

(71) Applicant: SAMSUNG ELECTRONICS CO., LTD., Suwon-si (KR)

(72) Inventors: Hyunho Choi, Yongin-si (KR); Hyunsu Seol, Hwaseong-si (KR); Yoodong Yang, Hwaseong-si (KR); Yujin Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 376 days.

(21) Appl. No.: 17/697,023

(22) Filed: Mar. 17, 2022

(65) Prior Publication Data
US 2023/0049240 A1 Feb. 16, 2023

(30) Foreign Application Priority Data
Aug. 13, 2021 (KR) .................. 10-2021-0107189

(51) Int. Cl.
*C23C 16/455* (2006.01)
*C23C 16/458* (2006.01)

(52) U.S. Cl.
CPC ...... *C23C 16/45578* (2013.01); *C23C 16/458* (2013.01)

(58) Field of Classification Search
CPC ............ C23C 16/45578; C23C 16/458; H01L 21/67017; H01L 21/67098–67115; H01L 21/67303–67309; H01L 21/6732; H01L 21/67323
See application file for complete search history.

(56) References Cited

U.S. PATENT DOCUMENTS

| 6,881,295 | B2 | 4/2005 | Nagakura | |
| 7,650,897 | B2 * | 1/2010 | Kopp | H01L 21/67051 239/548 |
| 8,298,386 | B2 * | 10/2012 | Wang | C23C 14/34 156/345.33 |
| 8,377,213 | B2 * | 2/2013 | Balasubramanyam | C23C 16/4401 156/345.31 |

(Continued)

FOREIGN PATENT DOCUMENTS

| JP | 1993-335247 A | 12/1993 |
| KR | 10-1003305 B1 | 12/2010 |

(Continued)

*Primary Examiner* — Benjamin Kendall
(74) *Attorney, Agent, or Firm* — Muir Patent Law, PLLC (57) ABSTRACT

A film forming apparatus including a bell-shaped chamber having an internal space and an exhaust port; a wafer boat in the bell-shaped chamber, and in which wafers are sequentially stackable from a lower end portion to an upper end portion; a gas supply pipe passing through the bell-shaped chamber to supply gas to the bell-shaped chamber; and an injector connected to the gas supply pipe to inject gas onto the wafers, wherein the injector includes a gas flow path through which the gas supplied from the gas supply pipe flows and nozzles connected to the gas flow path, stepped surfaces are on an inner surface of the injector such that a diameter of the gas flow paths in at least two different locations within the injector are different, and lengths of the nozzles are different from each other, and correspond with the diameter of the gas flow path.

6 Claims, 8 Drawing Sheets

(56) References Cited

U.S. PATENT DOCUMENTS

2001/0052556 A1    12/2001  Ting et al.
2012/0001972 A1     1/2012  Nishioka et al.
2014/0261174 A1*    9/2014  Yang .................. C23C 16/4408
                                                    118/715
2019/0330741 A1*   10/2019  Lee ................... C23C 16/45565

FOREIGN PATENT DOCUMENTS

KR         10-2239065  B1   12/2015
KR     10-2017-0133670  A   12/2017

* cited by examiner

FILM FORMING APPARATUS

CROSS-REFERENCE TO RELATED APPLICATION

This application claims benefit of priority to Korean Patent Application No. 10-2021-0107189 filed on Aug. 13, 2021, in the Korean Intellectual Property Office, the disclosure of which is incorporated herein by reference in its entirety.

BACKGROUND

1. Field

Embodiments relate to a film forming apparatus.

2. Description of the Related Art

In manufacturing a semiconductor device including a semiconductor integrated circuit, various processes such as film formation, etching, oxidation, diffusion, reformation, or the like may be performed on a target object, e.g., a semiconductor wafer. This type of film-forming process may be performed, e.g., in a batch-type film forming apparatus having a bell-shaped chamber.

SUMMARY

The embodiments may be realized by providing a film forming apparatus including a bell-shaped chamber having an internal space and having an exhaust port through which gas is exhaustable; a wafer boat in the bell-shaped chamber, and in which a plurality of wafers are sequentially stackable from a lower end portion to an upper end portion of the bell-shaped chamber; a gas supply pipe passing through the bell-shaped chamber to supply gas to the bell-shaped chamber; and an injector connected to the gas supply pipe to inject gas onto the plurality of wafers, wherein the injector includes a gas flow path through which the gas supplied from the gas supply pipe flows and a plurality of nozzles connected to the gas flow path therein, a plurality of stepped surfaces are on an inner surface of the injector such that diameters of the gas flow path in at least two different locations within the injector are different from each other, and lengths of the plurality of nozzles are different from each other, and correspond with the diameter of the gas flow path.

The embodiments may be realized by providing a film forming apparatus including a bell-shaped chamber having an internal space and having an exhaust port through which gas is exhaustable; a wafer boat in the bell-shaped chamber and in which a plurality of wafers are disposable in a length direction of the bell-shaped chamber; a gas supply pipe passing through the bell-shaped chamber to supply gas to the bell-shaped chamber; and an injector connected to the gas supply pipe to inject gas to the plurality of wafers, wherein the injector includes a plurality of portions having walls of different thicknesses, a plurality of nozzles are connected to each of the plurality of portions of the injector, the plurality of nozzles having different lengths depending on the thickness of corresponding portion of the wall of the injector, the injector has a constant outer diameter, and the plurality of nozzles each have the same diameter.

BRIEF DESCRIPTION OF DRAWINGS

Features will be apparent to those of skill in the art by describing in detail exemplary embodiments with reference to the attached drawings in which.

DETAILED DESCRIPTION

Figure 1:
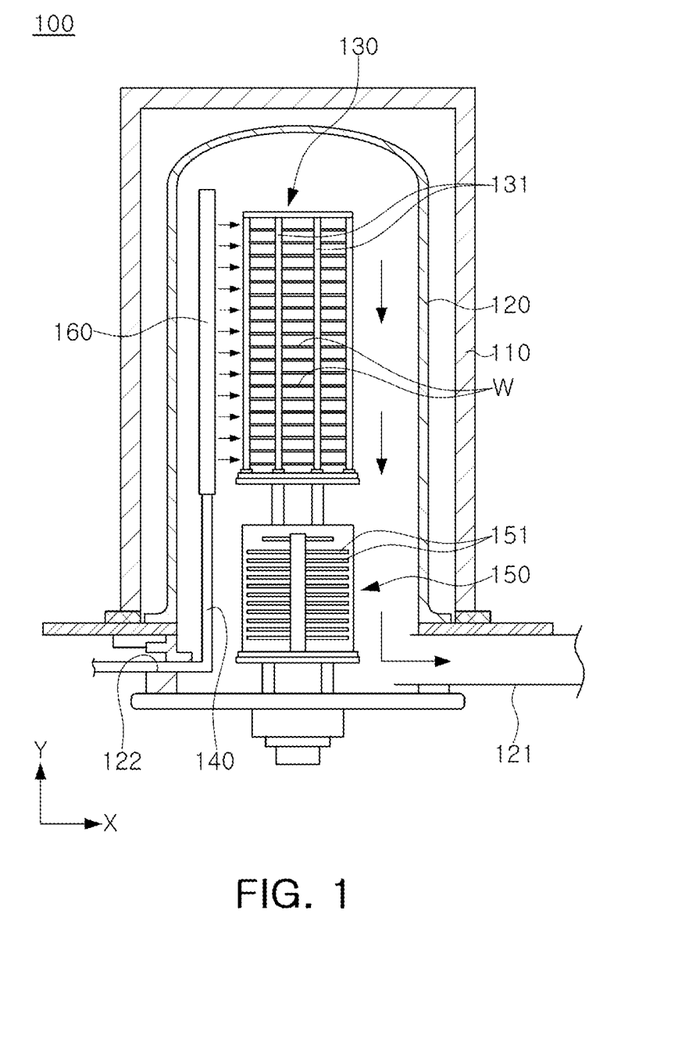
FIG. 1 is a configuration diagram schematically illustrating a film forming apparatus according to an embodiment.

FIG. 1 is a configuration diagram schematically illustrating a film forming apparatus according to an example embodiment.

Referring to FIG. 1, a film forming apparatus 100 may include, e.g., a bell-shaped chamber 120, a wafer boat 130, a gas supply pipe 140, a heat dissipation unit or heat dissipator 150, and an injector 160.

The bell-shaped chamber 120 may have an internal space, and may have an exhaust port 121 through which gas is exhausted or exhaustable. In an implementation, the bell-shaped chamber 120 may be in a heater 110 as a heating device. The heater 110 may provide thermal energy to the internal space of the bell-shaped chamber 120, and may cause the internal space of the bell-shaped chamber 120 to be heated. In an implementation, the heater 110 may be formed of a heat insulating member having a cylindrical shape (e.g., a circular cylindrical shape), and a heating element on an inner surface of the heat insulating member, and may be divided into a plurality of regions in a height direction to facilitate temperature control. In an implementation, the bell-shaped chamber 120 may include a through-hole 122 such that the gas supply pipe 140 for supplying gas to the internal space of the bell-shaped chamber 120 may be installed therethrough. The through-hole 122 may be in a lower end portion of the bell-shaped chamber 120.

In an implementation, the bell-shaped chamber 120 may be formed of a heat-resistant glass material, e.g., quartz ($SiO_2$), silicon carbide (SiC), or the like, and may have a circular cylindrical shape with a closed upper end and an open lower end. The bell-shaped chamber 120 may provide a space for a film forming process on a wafer W.

The wafer boat 130 may be in the bell-shaped chamber 120, and a plurality of wafers W may be sequentially stacked on the wafer boat 130 from a lower end portion to an upper end portion of the bell-shaped chamber 120. In an implementation, the wafer boat 130 may have a plurality of posts 131 for accommodating the plurality of wafers W in multiple steps. In an implementation, the wafer boat 130 may be formed of a heat-resistant glass material, e.g., quartz ($SiO_2$), silicon carbide (SiC), or the like, like the bell-shaped chamber 120.

The gas supply pipe 140 may be in the bell-shaped chamber 120, and one end of the gas supply pipe 140 may be in the bell-shaped chamber 120 through the through-hole 122 of the bell-shaped chamber 120. In an implementation, the gas supply pipe 140 may be connected to the injector 160 and may supply gas, injected to the wafer W, to the injector 160. In an implementation, as illustrated in the drawings, only one gas supply pipe 140 may be included, or a plurality of gas supply pipes 140 may be spaced apart from each other in a circumferential direction of the bell-shaped chamber 120. In an implementation, three gas supply pipes 140 may be in the bell-shaped chamber 120 and spaced apart from each other.

The heat dissipator 150 may be in the internal space of the bell-shaped chamber 120, e.g., below the wafer boat 130. In an implementation, the heat dissipator 150 may block outflow of heat to insulate the lower end portion of the bell-shaped chamber 120. To this end, the heat dissipator 150 may include a plurality of baffles 151, and the plurality of baffles 151 may be below the wafer boat 130 to form multiple steps.

The injector 160 may be connected to the gas supply pipe 140 to inject gas to the wafer W. Gas supplied from the injector 160 to the internal space of the bell-shaped chamber 120 may form downstream flowing from an upper portion to a lower portion of the bell-shaped chamber 120. In an implementation, the exhaust port 121 may be in the lower end portion of the bell-shaped chamber 120, and gas supplied to the internal space of the bell-shaped chamber 120 may form downstream flowing from an upper portion to a lower portion of the bell-shaped chamber 120 to discharge the gas externally through the exhaust port 121.

Therefore, a flow amount of gas in the lower end portion of the bell-shaped chamber 120 due to the downstream may increase, compared to in the upper end portion of the bell-shaped chamber 120.

Figure 2:
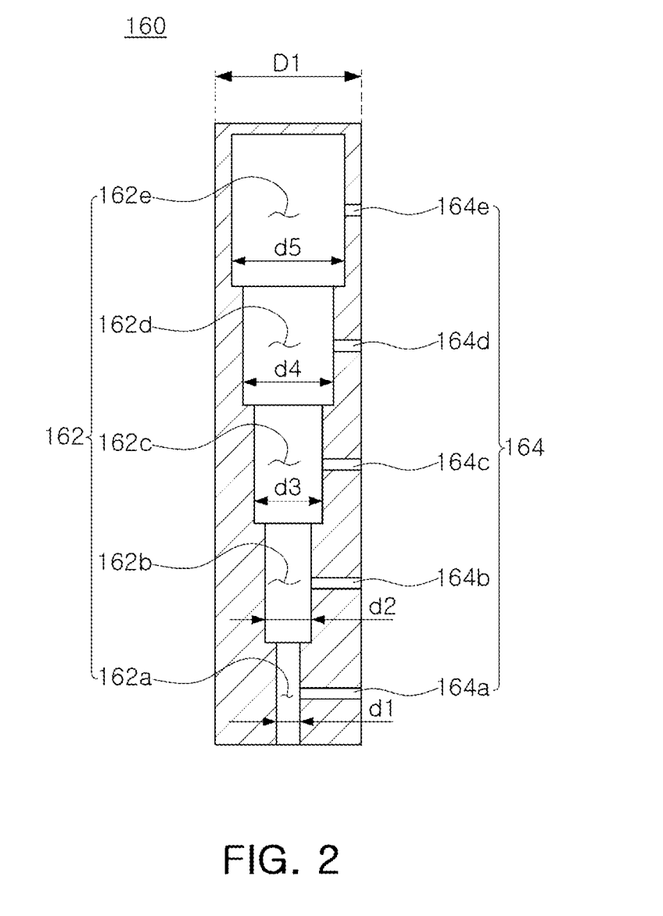
FIG. 2 is a cross-sectional view of an injector of a film forming apparatus according to an embodiment.

FIG. 2 is a cross-sectional view of an injector of a film forming apparatus according to an example embodiment.

Referring to FIGS. 1 and 2, a gas flow path 162 through which gas supplied from the gas supply pipe 140 flows, and a plurality of nozzles 164 connected to the gas flow path 162, may be in the injector 160.

The injector 160 may have a circular tube shape having a constant outer diameter D1, and may be upright, e.g., in a length direction of the bell-shaped chamber 120. In an implementation, the injector 160 may have a shape in which the upper end portion is closed, and the lower end portion is open. In some devices, gas supplied to the lower end portion of the injector 160 may be injected through the nozzle 164, and may not be discharged through an upper portion of the injector 160. In this case, a length direction refers to a Y-axis direction of FIG. 1, and a width direction refers to an X-axis direction of FIG. 1.

In an implementation, a plurality of stepped surfaces may be on an inner surface of the injector 160 such that a diameter of the gas flow path 162 in at least two portions is different from each other. In an implementation, the gas flow path 162 may include a first gas flow path 162a having the smallest diameter d1 and at a lowermost end portion of the injector 160, a second gas flow path 162b connected to the first gas flow path 162a and having a diameter d2, larger than the diameter d1 of the first gas flow path 162a, a third gas flow path 162c connected to the second gas flow path 162b and having a diameter d3, larger than the diameter d2 of the second gas flow path 162b, a fourth gas flow path 162d connected to the third gas flow path 162c and having a diameter d4, larger than the diameter d3 of the third gas flow path 162c, and a fifth gas flow path 162e connected to the fourth gas flow path 162d and having a diameter d5, larger than the diameter d4 of the fourth gas flow path 162d.

In an implementation, a plurality of step differences may be on the inner surface of the injector 160 such that a thickness of the injector 160 becomes thinner from a lower end portion to an upper end portion of the injector 160.

The injector 160 may include a plurality of nozzles 164. In an implementation, the plurality of nozzles 164 may be connected to the first to fifth gas flow paths 162a to 162e, respectively. In an implementation, the plurality of nozzles 164 may include a first nozzle 164a connected to the first gas flow path 162a, a second nozzle 164b connected to the second gas flow path 162b, a third nozzle 164c connected to the third gas flow path 162c, a fourth nozzle 164d connected to the fourth gas flow path 162d, and a fifth nozzle 164e connected to the fifth gas flow path 162e.

In an implementation, diameters of the first to fifth nozzles 164a to 164e may be the same, and lengths of the first to fifth nozzles 164a to 164e may be different from each other. In an implementation, a length of the first nozzle 164a may be the longest, and a length of the fifth nozzle 164e may be the shortest.

Diameters of the first to fifth gas flow paths 162a to 162e may be different from each other, and amounts of gases injected through the nozzle 164 may also be different from each other. In an implementation, an amount of gas injected through the first nozzle 164a connected to the first gas flow path 162a may be the smallest, and an amount of gas injected through the fifth nozzle 164e connected to the fifth gas flow path 162e may be the largest. A length of the first nozzle 164a may be longer than a length of the fifth nozzle 164e, straightness of gas injected through the first nozzle 164a may be improved, compared to straightness of gas injected through the fifth nozzle 164e. In an implementation, gas injected through the first nozzle 164a may be more smoothly supplied to a central portion of the wafer W, compared to gas injected through the fifth nozzle 164e.

A center (of or relative to an outer diameter) of the injector 160 may be concentric with a center (of or relative to a diameter) of the gas flow path 162.

In an implementation, a diameter of the gas flow path 162 in the injector 160 and a length of the nozzle 164 connected to the gas flow path 162 may be adjusted to help control an injection amount and straightness of gas supplied to the wafer W, to form a uniform film on the wafer W.

In an implementation, as illustrated in the drawings, the gas flow path 162 may include the first to fifth gas flow paths 162a to 162e, and the first to fifth nozzles 164a to 164e may be respectively in the first to fifth gas flow paths 162a to 162e. In an implementation, the number of gas flow paths 162 and the number of nozzles 164 may be variously changed. In an implementation, the gas flow path 162 may include first to Nth gas flow paths, and the nozzle 164 may include first to Nth nozzles (where, N is natural numbers). In an implementation, as illustrated in the drawings, each of the nozzles 164 may be connected to the first to fifth gas flow paths 162a to 162e, or a plurality of nozzles may be connected to one gas flow path.

Figure 3:
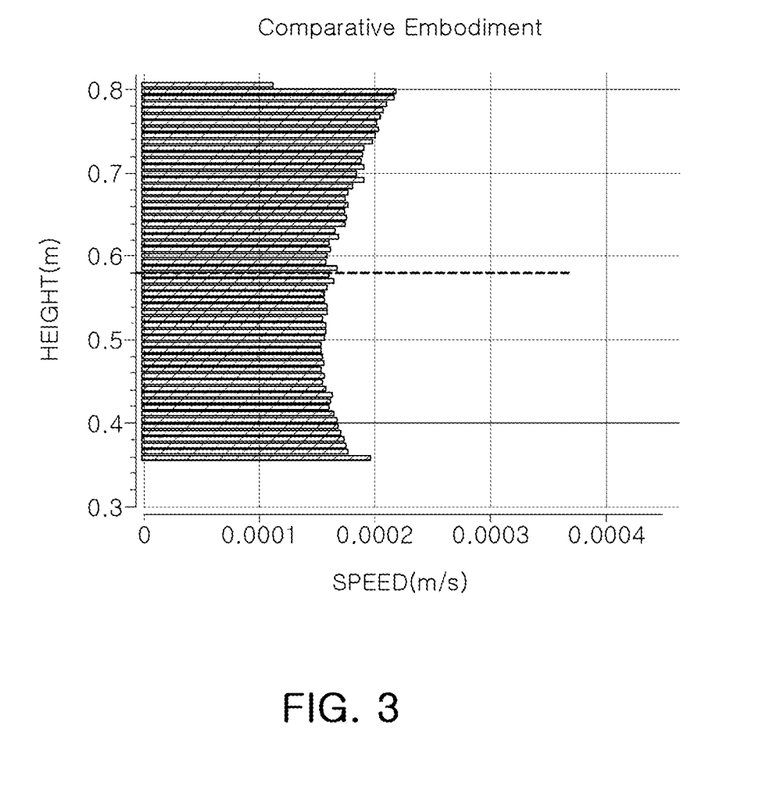
FIG. 3 is a graph showing an effect of an injector of a film forming apparatus according to a Comparative Embodiment.
Figure 4:
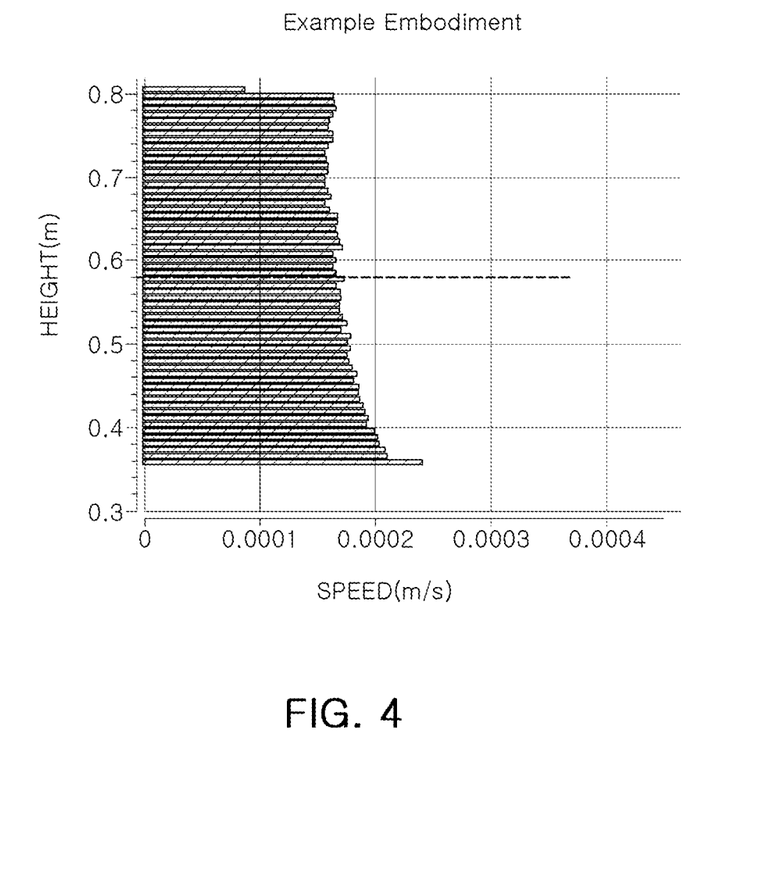
FIG. 4 is a graph showing an effect of an injector of a film forming apparatus according to an Example Embodiment.

FIG. 3 is a graph showing an effect of an injector provided in a film forming apparatus according to a Comparative Embodiment, and FIG. 4 is a graph showing an effect of an injector provided in a film forming apparatus according to an Example Embodiment.

FIG. 3 is a graph showing an effect of an injector according to a Comparative Embodiment in which a diameter of a nozzle 164 is changed while a thickness of an injector 160 is maintained constant, and FIG. 4 is a graph showing an effect of an injector of a film forming apparatus according to an embodiment described above.

As illustrated in FIG. 3, it may be seen that more gas may be supplied to a lower region by an injector according to the Comparative Embodiment, compared to an upper region. As illustrated in FIG. 4, it may be seen that more gas may be supplied to an upper region by an injector of a film forming apparatus according to the Example Embodiment, compared to a lower region. It may be seen that 6.2% more gas may be supplied in the lower region by the injector according to the Comparative Embodiment, compared to the upper region. It may be seen that 6.8% more gas may be supplied to the upper region by the injector of the film forming apparatus according to the Example Embodiment, compared to the lower region.

As described above, straightness of gas injected by a nozzle 164 (refer to FIG. 2) of the lower region may be improved, even when downstream is formed in a lower end portion of a bell-shaped chamber 120 (refer to FIG. 1), and the gas may be more smoothly supplied to a central portion of a wafer W.

Referring to FIGS. 1 to 4, gas supplied from the injector 160 to the internal space of the bell-shaped chamber 120 may form downstream flowing from an upper portion to a lower portion of the bell-shaped chamber 120. In an implementation, the exhaust port 121 may be in the lower end portion of the bell-shaped chamber 120, and gas supplied to the internal space of the bell-shaped chamber 120 may form downstream flowing from an upper portion to a lower portion of the bell-shaped chamber 120 to discharge the gas externally through the exhaust port 121.

In an implementation, a flow amount of gas in the lower end portion of the bell-shaped chamber 120 due to the downstream may increase, compared to in the upper end portion of the bell-shaped chamber 120.

As illustrated in FIG. 4, more gas may be supplied from an upper region of the bell-shaped chamber 120, compared to a lower region, and a sum of a supply amount of gas by the downstream and a supply amount of gas by the first nozzle 164a in the lower end portion of the bell-shaped chamber 120 may be reduced, compared to the Comparative Embodiment, and non-uniformity of a film generated on a wafer W in the lower end portion of the bell-shaped chamber 120 may be suppressed. In the Comparative Example, gas supplied from a nozzle at the lowermost end of an injector 160 downstream may not reach a central portion of a wafer W, there may be a problem that a thickness of a film formed in an edge portion of the wafer W is greater than a thickness of a film formed in the central portion of the wafer W. A length of the first nozzle 164a may increase to help improve straightness of gas injected from the first nozzle 164a, and the gas injected from the first nozzle 164a may be supplied to a central portion of a wafer W. In an implementation, it is possible to help prevent a thickness of a film formed in an edge portion of a wafer W from being greater than a thickness of a film formed in a central portion of the wafer W.

Hereinafter, injectors according to example embodiments will be described with reference to the drawings.

Figure 5:
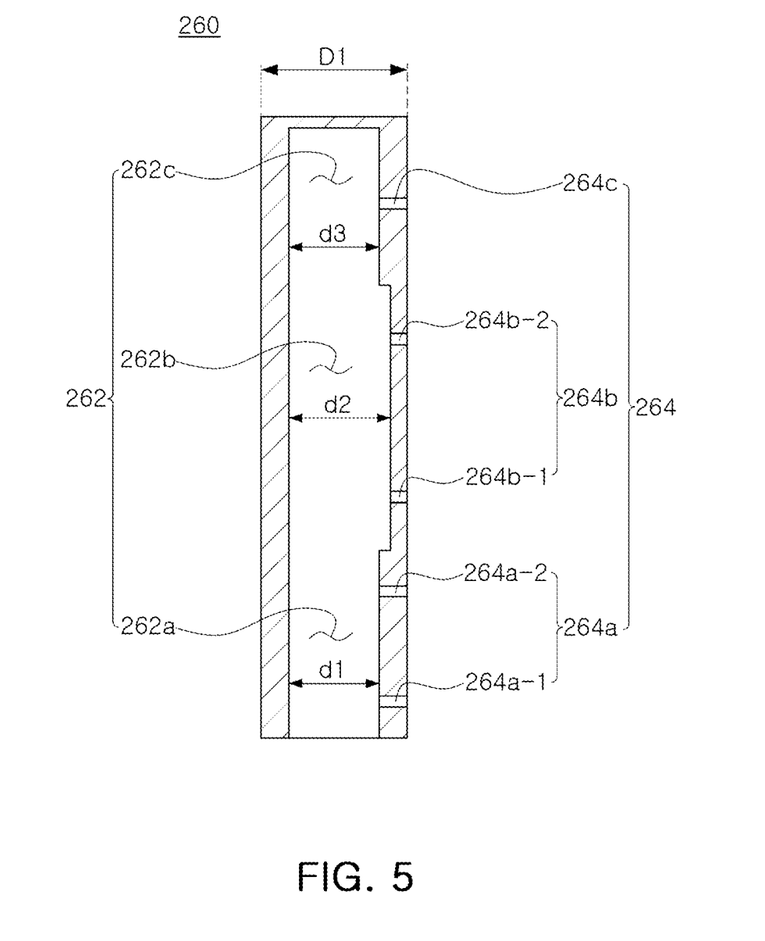
FIGS. 5 to 8 are cross-sectional views of an injector of a film forming apparatus according to an embodiment.

FIG. 5 is a cross-sectional view of an injector of a film forming apparatus according to an example embodiment.

Referring to FIG. 5, a gas flow path 262 through which gas supplied from a gas supply pipe 140 (refer to FIG. 1) flows, and a plurality of nozzles 264 connected to the gas flow path 262 may be in an injector 260.

The injector 260 may have a circular tube shape having a constant outer diameter D1, and may be disposed in a length direction of a bell-shaped chamber 120 (refer to FIG. 1). In an implementation, the injector 260 may have a shape in which an upper end portion is closed and a lower end portion is open. In an implementation, gas supplied to the lower end portion of the injector 260 may be injected through the nozzle 264, and may not be discharged through an upper portion of the injector 260.

In an implementation, a plurality of stepped surfaces may be on an inner surface of the injector 260 such that a diameter of the gas flow path 262 in at least two portions is different from each other. In an implementation, the gas flow path 262 may include a first gas flow path 262a connected to the gas supply pipe 140 and having a diameter d1, a second gas flow path 262b connected to the first gas flow path 262a and having a diameter d2, larger than the diameter d1 of the first gas flow path 262a, and a third gas flow path 262c connected to the second gas flow path 262b and having a diameter d3, smaller than the diameter d2 of the second gas flow path 262b.

In an implementation, a thickness of (e.g., outer walls of) a central portion of the injector 260 may be the thinnest, and a thickness of an upper end portion and a thickness of a lower end portion of the injector 260 may be thicker than the thickness of the central portion of the injector 260. In an implementation, a plurality of step differences may be on an inner surface of the injector 260.

In an implementation, the injector 260 may include a plurality of nozzles 264, and the plurality of nozzles 264 may be connected to the first to third gas flow paths 262a to 262c, respectively. In an implementation, the plurality of nozzles 264 may include a first nozzle 264a connected to the first gas flow path 262a, a second nozzle 264b connected to the second gas flow path 262b, and a third nozzle 264c connected to the third gas flow path 262c. In an implementation, the first nozzle 264a may include a 1-1 nozzle 264a-1 at a lowermost end portion of the injector 260, and a 1-2 nozzle 264a-2 above the 1-1 nozzle 264a-1. In an implementation, the second nozzle 264b may include a 2-1 nozzle 264b-1 above the 1-2 nozzle 264a-2, and a 2-2 nozzle 264b-2 above the 2-1 nozzle 264b-1.

In an implementation, diameters of the first to third nozzles 164a to 164c may be the same. In an implementation, a length of the second nozzle 264b may be shorter than a length of the first nozzle 264a, and the length of the second nozzle 264b may be shorter than a length of the third nozzle 264c. In an implementation, the length of the first nozzle 264a may be the same as the length of the third nozzle 264c.

The diameter d2 of the second gas flow path 262b at the central portion of the injector 260 may be the largest, the diameter d1 of the first gas flow path 262a and the diameter d3 of the third gas flow path 262c may be respectively smaller than the diameter d2 of the second gas flow path 262b, and an amount of gas injected through the second nozzle 264b connected to the second gas flow path 262b may be the largest.

In an implementation, the first nozzle 264a connected to the first gas flow path 262a may be provided as two first nozzles 264a, the third nozzle 264c connected to the third gas flow path 262c may be provided as one third nozzle 264c, and a supply amount of gas supplied through the first nozzle 264a may be greater than a supply amount of gas supplied through the third nozzle 264c.

The length of the first nozzle 264a and the length of the third nozzle 264c may be respectively longer than the length of the second nozzle 264b, and straightness of gas injected through the first nozzle 264a and straightness of gas injected through the third nozzle 264c may be improved, compared to straightness of gas injected through the second nozzle 264b. In an implementation, the gas injected through the first nozzle 264a and the gas injected through the third nozzle 264c may be more smoothly supplied to a central portion of a wafer W, compared to the gas injected through the second nozzle 264b.

In an implementation, a center of the diameter d2 of the second gas flow path 262b may be eccentric (e.g., may not share a center point) from or relative to a center of an outer diameter of the injector 260 (e.g., the center of the second gas flow path 262b may be offset relative to the center of the injector 260). A center of the diameter d1 of the first gas flow path 262a and a center of the diameter d3 of the third gas flow path 262c may be concentric with the center of the outer diameter of the injector 260.

In this manner, an amount of gas supplied through the second nozzle 264b connected to the second gas flow path 262b may increase. In addition, an amount of gas supplied through the first nozzle 264a connected to the first gas flow path 262a may be greater than an amount of gas supplied through the third nozzle 264c connected to the third gas flow path 262c. In an implementation, a uniform amount of gas may be supplied from an upper portion to a lower portion of the bell-shaped chamber 120. The lengths of the first nozzles 264a and the third nozzles 264c at the upper and lower portions of the injector 260 may be respectively configured to be longer than the length of the second nozzle 264b, to more smoothly supply gas to the central portion of the wafer W in the upper and lower portions of the injector 260.

Figure 6:
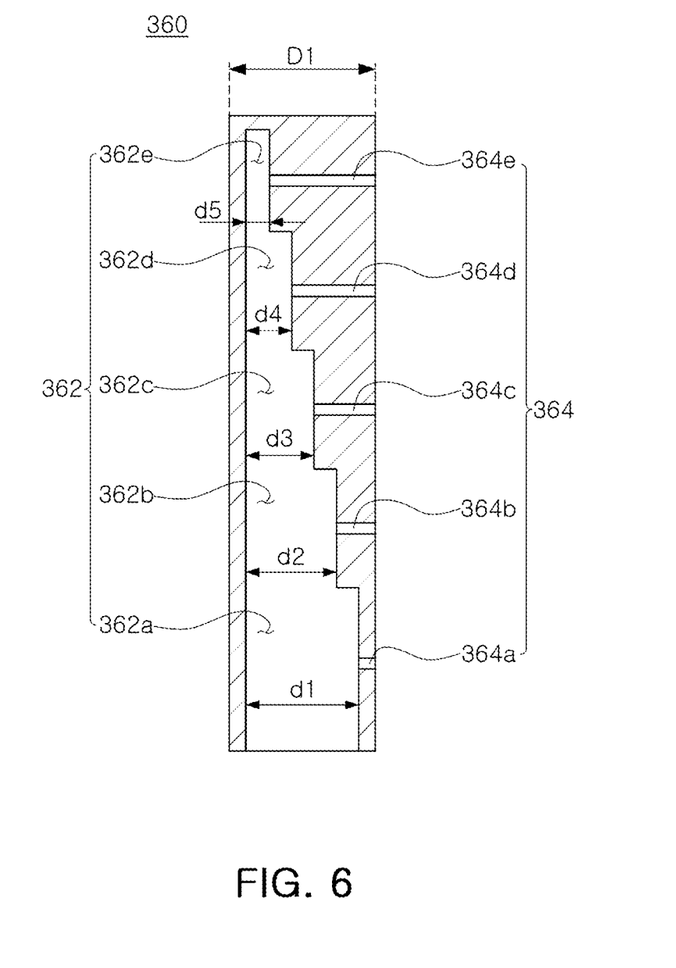

FIG. 6 is a cross-sectional view of an injector of a film forming apparatus according to an example embodiment.

Referring to FIG. 6, a gas flow path 362 through which gas supplied from a gas supply pipe 140 (refer to FIG. 1) flows, and a plurality of nozzles 364 connected to the gas flow path 362 may be in an injector 360.

The injector 360 may have a circular tube shape having a constant outer diameter D1, and may be disposed in a length direction of a bell-shaped chamber 120 (refer to FIG. 1). In an implementation, the injector 360 may have a shape in which an upper end portion is closed and a lower end portion is open. In an implementation, gas supplied to the lower end portion of the injector 360 may be injected through the nozzle 364, and may not be discharged through an upper portion of the injector 360.

In an implementation, a plurality of stepped surfaces may be on an inner surface of the injector 360 such that a diameter of the gas flow path 362 in at least two portions is different from each other. In an implementation, the gas flow path 362 may include a first gas flow path 362a having the largest diameter d1 and at a lowermost end portion of the injector 360, a second gas flow path 362b connected to the first gas flow path 362a and having a diameter d2, smaller than the diameter d1 of the first gas flow path 362a, a third gas flow path 362c connected to the second gas flow path 362b and having a diameter d3, smaller than the diameter d2 of the second gas flow path 362b, a fourth gas flow path 362d connected to the third gas flow path 362c and having a diameter d4, smaller than the diameter d3 of the third gas flow path 362c, and a fifth gas flow path 362e connected to the fourth gas flow path 362d and having a diameter d5, smaller than the diameter d4 of the fourth gas flow path 362d.

In an implementation, a plurality of step differences may be on an inner surface of the injector 360 such that a thickness of a portion of the injector 360 (e.g., a thickness of walls of the injector 360) becomes thicker from a lower end portion to an upper end portion of the injector 360.

The injector 360 may include plurality of nozzles 364, and the plurality of nozzles 364 may be connected to the first to fifth gas flow paths 362a to 362e, respectively. In an implementation, the plurality of nozzles 364 may include a first nozzle 364a connected to the first gas flow path 362a, a second nozzle 364b connected to the second gas flow path 362b, a third nozzle 364c connected to the third gas flow path 362c, a fourth nozzle 364d connected to the fourth gas flow path 362d, and a fifth nozzle 364e connected to the fifth gas flow path 362e.

In an implementation, diameters of the first to fifth nozzles 364a to 364e may be the same, and lengths of the first to fifth nozzles 364a to 364e may be different from each other. In an implementation, a length of the first nozzle 364a may be the shortest, and a length of the fifth nozzle 364e may be the longest.

Diameters of the first to fifth gas flow paths 362a to 362e may be different from each other, and amounts of gases injected through the nozzle 364 may also be different from each other. In an implementation, an amount of gas injected through the first nozzle 364a connected to the first gas flow path 362a may be the largest, and an amount of gas injected through the fifth nozzle 364e connected to the fifth gas flow path 362e may be the smallest. A length of the fifth nozzle 364e may be longer than a length of the first nozzle 364a, and straightness of gas injected through the fifth nozzle 364e may be improved, compared to straightness of gas injected through the first nozzle 364a. In an implementation, gas injected through the fifth nozzle 364e may be more smoothly supplied to a central portion of the wafer W, compared to gas injected through the first nozzle 364a.

Centers of diameters of the second to fifth gas flow paths 362b to 362e among the gas flow paths 362 may be eccentric from or relative to a center of an outer diameter of the injector 360.

Figure 7:
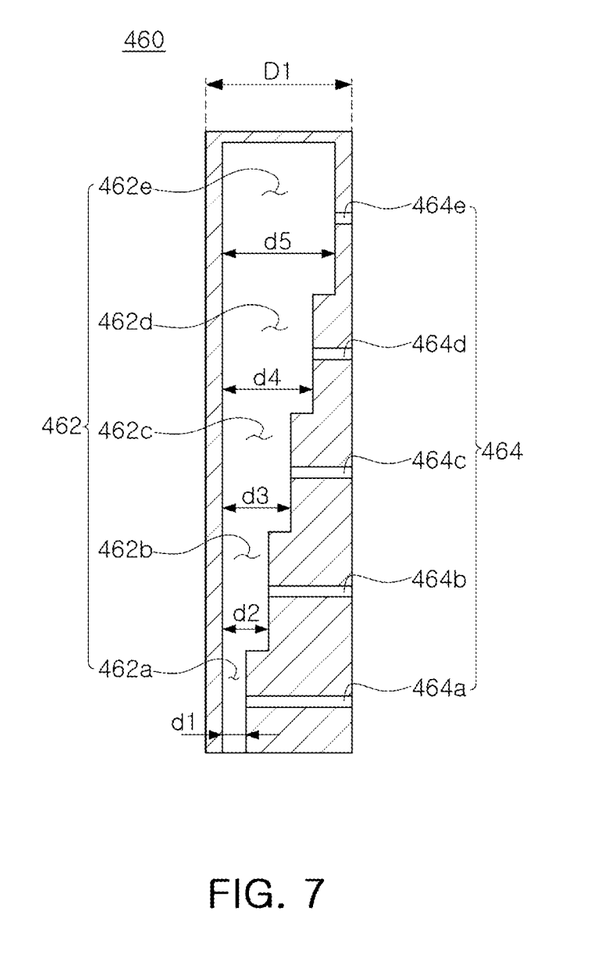

FIG. 7 is a cross-sectional view of an injector of a film forming apparatus according to an example embodiment.

Referring to FIG. 7, a gas flow path 462 through which gas supplied from a gas supply pipe 140 (refer to FIG. 1) flows, and a plurality of nozzles 464 connected to the gas flow path 462 may be in an injector 460.

The injector 460 may have a circular tube shape having a constant outer diameter D1, and may be disposed in a length direction of a bell-shaped chamber 120 (refer to FIG. 1). In an implementation, the injector 460 may have a shape in which an upper end portion is closed and a lower end portion is open. In an implementation, gas supplied to the lower end portion of the injector 460 may be injected through the nozzle 464, and may not be discharged through an upper portion of the injector 460.

In an implementation, a plurality of stepped surfaces may be on an inner surface of the injector 460 such that a diameter of the gas flow path 462 in at least two portions is different from each other. In an implementation, the gas flow path 462 may include a first gas flow path 462a having the smallest diameter d1 and at a lowermost end portion of the injector 460, a second gas flow path 462b connected to the first gas flow path 462a and having a diameter d2, larger than the diameter d1 of the first gas flow path 462a, a third gas flow path 462c connected to the second gas flow path 462b and having a diameter d3, larger than the diameter d2 of the second gas flow path 462b, a fourth gas flow path 462d connected to the third gas flow path 462c and having a diameter d4, larger than the diameter d3 of the third gas flow path 462c, and a fifth gas flow path 462e connected to the fourth gas flow path 462d and having a diameter d5, larger than the diameter d4 of the fourth gas flow path 462d.

In an implementation, a plurality of step differences may be on the inner surface of the injector 460 such that a thickness of the injector 460 becomes thinner from a lower end portion to an upper end portion of the injector 460.

In an implementation, the injector 460 may include plurality of nozzles 464, and the plurality of nozzles 464 may be connected to the first to fifth gas flow paths 462a to 462e, respectively. In an implementation, the plurality of nozzles 464 may include a first nozzle 464a connected to the first gas flow path 462a, a second nozzle 464b connected to the second gas flow path 462b, a third nozzle 464c connected to the third gas flow path 462c, a fourth nozzle 464d connected to the fourth gas flow path 462d, and a fifth nozzle 464e connected to the fifth gas flow path 462e.

In an implementation, diameters of the first to fifth nozzles 464a to 464e may be the same, and lengths of the first to fifth nozzles 464a to 464e may be different from each other. In an implementation, a length of the first nozzle 464a may be the longest, and a length of the fifth nozzle 464e may be the shortest.

Diameters of the first to fifth gas flow paths 462a to 462e may be different from each other, and amounts of gases injected through the nozzle 464 may also be different from each other. In an implementation, an amount of gas injected through the first nozzle 464a connected to the first gas flow path 462a may be the smallest, and an amount of gas injected through the fifth nozzle 464e connected to the fifth gas flow path 462e may be the largest. A length of the first nozzle 464a may be longer than a length of the fifth nozzle 464e, and straightness of gas injected through the first nozzle 464a may be improved, compared to straightness of gas injected through the fifth nozzle 464e. In an implementation, gas injected through the first nozzle 464a may be more smoothly supplied to a central portion of the wafer W, compared to gas injected through the fifth nozzle 464e.

Centers of diameters of the first to fourth gas flow paths 462a to 462d among the gas flow paths 462 may be eccentric (e.g., offset) from a center of an outer diameter of the injector 460.

Figure 8:
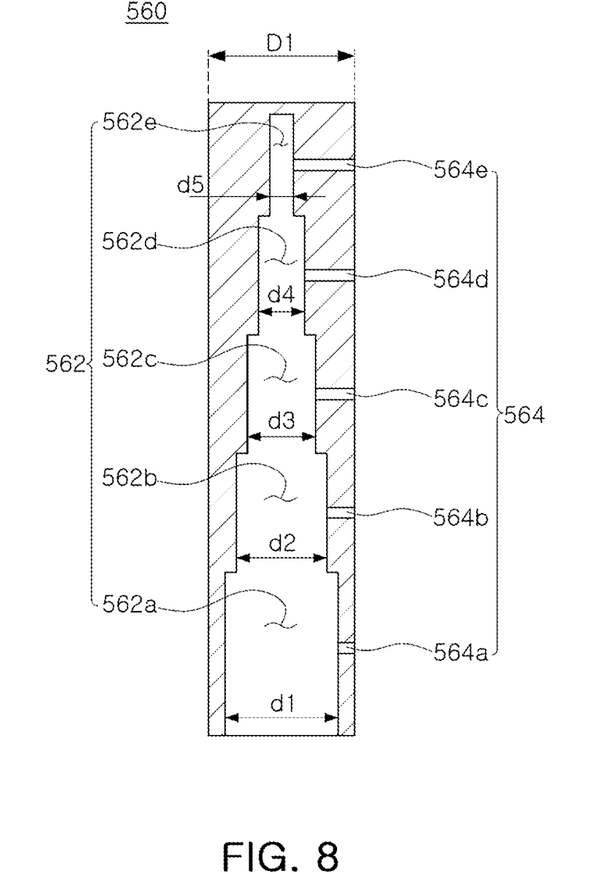

FIG. 8 is a cross-sectional view of an injector of a film forming apparatus according to an example embodiment.

Referring to FIG. 8, a gas flow path 562 through which gas supplied from a gas supply pipe 140 (refer to FIG. 1) flows, and a plurality of nozzles 564 connected to the gas flow path 562 may be in an injector 560.

The injector 560 may have a circular tube shape having a constant outer diameter D1, and may be disposed in a length direction of a bell-shaped chamber 120 (refer to FIG. 1). In an implementation, the injector 560 may have a shape in which an upper end portion is closed and a lower end portion is open. In an implementation, gas supplied to the lower end portion of the injector 560 may be injected through the nozzle 564, and may not be discharged through an upper portion of the injector 560.

In an implementation, a plurality of stepped surfaces may be on an inner surface of the injector 560 such that a diameter of the gas flow path 562 in at least two portions is different from each other. In an implementation, the gas flow path 562 may include a first gas flow path 562a having the largest diameter d1 and at a lowermost end portion of the injector 560, a second gas flow path 562b connected to the first gas flow path 562a and having a diameter d2, smaller than the diameter d1 of the first gas flow path 562a, a third gas flow path 562c connected to the second gas flow path 562b and having a diameter d3, smaller than the diameter d2 of the second gas flow path 562b, a fourth gas flow path 562d connected to the third gas flow path 562c and having a diameter d4, smaller than the diameter d3 of the third gas flow path 562c, and a fifth gas flow path 562e connected to the fourth gas flow path 562d and having a diameter d5, smaller than the diameter d4 of the fourth gas flow path 562d.

In an implementation, a plurality of step differences may be on the inner surface of the injector 560 such that a thickness of (e.g., a wall of) the injector 560 becomes thicker from a lower end portion to an upper end portion of the injector 560.

In an implementation, the injector 560 may include plurality of nozzles 564, and the plurality of nozzles 564 may be connected to the first to fifth gas flow paths 562a to 562e, respectively. In an implementation, the plurality of nozzles 564 may include a first nozzle 564a connected to the first gas flow path 562a, a second nozzle 564b connected to the second gas flow path 562b, a third nozzle 564c connected to the third gas flow path 562c, a fourth nozzle 564d connected to the fourth gas flow path 562d, and a fifth nozzle 564e connected to the fifth gas flow path 562e.

In an implementation, diameters of the first to fifth nozzles 564a to 564e may be the same, and lengths of the first to fifth nozzles 564a to 564e may be different from each other. In an implementation, a length of the first nozzle 564a may be the shortest, and a length of the fifth nozzle 564e may be the longest.

Diameters of the first to fifth gas flow paths 562a to 562e may be different from each other, and amounts of gases injected through the nozzle 564 may also be different from each other. In an implementation, an amount of gas injected through the first nozzle 564a connected to the first gas flow path 562a may be the largest, and an amount of gas injected through the fifth nozzle 564e connected to the fifth gas flow path 562e may be the smallest. A length of the fifth nozzle 564e may be longer than a length of the first nozzle 564a, and straightness of gas injected through the fifth nozzle 564e may be improved, compared to straightness of gas injected through the first nozzle 564a. In an implementation, gas injected through the fifth nozzle 564e may be more smoothly supplied to a central portion of the wafer W, compared to gas injected through the first nozzle 564a.

A center of a diameter of the gas flow path 562 may be concentric with a center of an outer diameter of the injector 560.

By way of summation and review, it is possible that a uniform film may not be formed on a wafer, since an amount of gas supplied to a wafer above or near a top end of a bell-shaped chamber and an amount of gas supplied to a wafer below or near a lower end the bell-shaped chamber may be different to each other.

One or more embodiments may provide a film forming apparatus in which a uniform film is formed on a wafer by controlling an amount of gas supplied to and straightness of gas injected to wafers arranged in an upper portion and a lower portion of a bell-shaped chamber.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A film forming apparatus, comprising:
   a bell-shaped chamber having an internal space and having an exhaust port through which gas is exhaustible;
   a wafer boat in the bell-shaped chamber, and in which a plurality of wafers are sequentially stackable from a lower end portion to an upper end portion of the bell-shaped chamber;

a gas supply pipe passing through the bell-shaped chamber to supply gas to the bell-shaped chamber; and an injector connected to the gas supply pipe to inject gas onto the plurality of wafers and having a circular tube shape having a constant outer diameter, wherein:
- the injector includes a gas flow path through which the gas supplied from the gas supply pipe flows and a plurality of nozzles connected to the gas flow path therein,
- a plurality of stepped surfaces are on an inner surface of the injector such that diameters of the gas flow path in at least two different locations within the injector are different from each other, and
- lengths of the plurality of nozzles are different from each other, and correspond with the diameters of the gas flow path, wherein the gas flow path includes:
- a first gas flow path connected to the gas supply pipe, and
- second to Nth gas flow paths connected to the first gas flow path and sequentially connected from the first gas flow path, N being a natural number, wherein each gas flow path of the first to Nth gas flow paths is a gas flow path with a substantially constant diameter, wherein the first gas flow path has a first flow path having a first diameter, the second gas flow path has a second flow path having a second diameter, the first diameter is smaller than the second diameter, and diameters of the second to Nth gas flow paths sequentially increase in a stepwise manner from the second diameter of the second gas flow path, wherein the plurality of nozzles includes:
- a first nozzle extending from an outer surface of the injector to the first gas flow path, and
- second to Nth nozzles sequentially and respectively extending from the outer surface of the injector to the second to Nth gas flow paths, and wherein a length of the first nozzle is longer than a length of the second nozzle, and lengths of the second to Nth nozzles sequentially decrease from the second nozzle.

2. The film forming apparatus as claimed in claim 1, wherein the injector:
is disposed in a length direction of the bell-shaped chamber.

3. The film forming apparatus as claimed in claim 2, wherein a center of the first diameter of the first gas flow path to a center of the diameter of the N−1th gas flow of the constant outer diameter of the injector are eccentric from a center of the constant outer diameter of the injector.

4. The film forming apparatus as claimed in claim 1, wherein a center relative to the constant outer diameter of the injector is concentric with centers relative to each of the diameters of the first to Nth gas flow paths.

5. The film forming apparatus as claimed in claim 1, wherein the plurality of nozzles each have the same diameter.

6. A film forming apparatus, comprising:
a bell-shaped chamber having an internal space and having an exhaust port through which gas is exhaustible;

a wafer boat in the bell-shaped chamber and in which a plurality of wafers are disposable in a length direction of the bell-shaped chamber;

a gas supply pipe passing through the bell-shaped chamber to supply gas to the bell-shaped chamber; and an injector connected to the gas supply pipe to inject gas to the plurality of wafers and having a circular tube shape having a constant diameter, wherein the injector includes:
- a plurality of portions having walls of different thicknesses and having different, inner diameters from each other, of each portion of the plurality of portions has a flow path with a substantially constant inner diameter; and
- a plurality of nozzles connected to each of the plurality of portions of the injector and having different lengths depending on the thickness of corresponding portion of a wall of the injector, wherein the plurality of nozzles each have the same diameter, wherein the plurality of portions include:
- a first portion connected to the gas supply pipe, and
- second to Nth portions connected to the first portion and sequentially connected from the first portion, N being a natural number, wherein each portion of the first to Nth portions is a gas flow path with a substantially constant diameter, wherein the first portion has a first gas flow path having a first diameter, the second portion has a second gas flow path having a second diameter, the first diameter is smaller than the second diameter, wherein the second to Nth portions have second to Nth gas flow paths, wherein diameters of the second to Nth gas flow paths sequentially increase in a stepwise manner from the second diameter of the second portion, wherein the plurality of nozzles includes:
- a first nozzle extending from an outer surface of the injector to the first gas flow path, and
- second to Nth nozzles sequentially and respectively extending from the outer surface of the injector to the second to Nth gas flow paths, and wherein a length of the first nozzle is longer than a length of the second nozzle, and lengths of the second to Nth nozzles sequentially decrease from the second nozzle.

* * * * *